(12) United States Patent
Radigan et al.

(10) Patent No.: US 7,575,984 B2
(45) Date of Patent: Aug. 18, 2009

(54) CONDUCTIVE HARD MASK TO PROTECT PATTERNED FEATURES DURING TRENCH ETCH

(75) Inventors: Steven J Radigan, Fremont, CA (US);
Usha Raghuram, San Jose, CA (US);
Samuel V Dunton, San Jose, CA (US);
Michael W Konevecki, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 0 days.

(21) Appl. No.: 11/444,936

(22) Filed: May 31, 2006

(65) Prior Publication Data

US 2007/0284656 A1    Dec. 13, 2007

(51) Int. Cl.
*H01L 21/326* (2006.01)
*H01L 21/82* (2006.01)
*H01L 21/44* (2006.01)

(52) U.S. Cl. ............... 438/467; 438/131; 438/600; 438/700

(58) Field of Classification Search .......... 257/428, 257/E27.046, E27.051, E27.073, E23.147, 257/530; 438/128–131, 257–259, 467, 600, 438/700
See application file for complete search history.

(56) References Cited

U.S. PATENT DOCUMENTS

| 5,767,012 | A | * | 6/1998 | Fulford et al. ............... 438/622 |
| 6,015,738 | A |   | 1/2000 | Levy et al. |
| 6,043,163 | A |   | 3/2000 | Tsai et al. |
| 6,326,270 | B1 |  | 12/2001 | Lee et al. |
| 6,828,229 | B2 | * | 12/2004 | Lee et al. ................. 438/638 |
| 6,872,603 | B2 | * | 3/2005 | Doi ............................ 438/149 |
| 7,037,762 | B2 | * | 5/2006 | Joo et al. ................... 438/128 |
| 7,041,595 | B2 | * | 5/2006 | Chopra ...................... 438/643 |
| 2003/0003647 | A1 |  | 1/2003 | Dennison et al. |
| 2004/0208039 | A1 |  | 10/2004 | Lowrey et al. |
| 2005/0121742 | A1 |  | 6/2005 | Petti et al. |
| 2006/0094154 | A1 |  | 5/2006 | Lung |

FOREIGN PATENT DOCUMENTS

| EP | 1 475 840 A1 | 11/2004 |
| WO | WO 2005/018002 A2 | 2/2005 |
| WO | WO2007-143387 | 12/2007 |

OTHER PUBLICATIONS

International Preliminary Report on Patentability of International Application No. PCT/US2007/069450 (SD-MXA-173-PCT) dated Dec. 18, 2008.
International Search Report and Written Opinion of International Application No. PCT/US2007/069450 (SD-MXA-173-PCT) dated Nov. 12, 2007.

* cited by examiner

*Primary Examiner*—Hung Vu
(74) *Attorney, Agent, or Firm*—Dungan & Dungan, PC

(57) ABSTRACT

A method is provided for forming patterned features using a conductive hard mask, where the conductive hard mask protects those features during a subsequent trench etch to form Damascene conductors providing electrical connection to those features from above. The thickness of the hard mask provides a margin to avoid overetch during the trench etch which may be harmful to device performance. The method is advantageously used in formation of a monolithic three dimensional memory array.

17 Claims, 8 Drawing Sheets

CONDUCTIVE HARD MASK TO PROTECT PATTERNED FEATURES DURING TRENCH ETCH

BACKGROUND OF THE INVENTION

The invention relates to a method to protect underlying active features during a trench etch.

Electrical connection to devices may be provided by forming conductors above those devices. Conductors can be formed by subtractive or by additive (Damascene) means. In either case an etch is performed that will stop on or near the devices to be contacted.

During any etch, care must be taken to stop the etch at the desired point. Depending on the device, overetch may or may not be acceptable.

In devices in which overetch during a Damascene trench etch is harmful to the device, a method to prevent such harm is advantageous.

SUMMARY OF THE PREFERRED EMBODIMENTS

The present invention is defined by the following claims, and nothing in this section should be taken as a limitation on those claims. In general, the invention is directed to a method to protect underlying features during a trench etch, and to the structures formed using such a method.

A first aspect of the invention provides for a method for forming a semiconductor device, the method comprising: depositing a layer of semiconductor material; depositing a first conductive layer or layerstack above the semiconductor material; patterning and etching the first conductive layer or layerstack and the semiconductor material into first pillars in a single photolithography step; depositing a dielectric layer above the first pillars; and etching trenches in the dielectric layer, wherein a portion of the first conductive layer or layerstack is exposed in the trenches, wherein the semiconductor material is not exposed in the trenches, wherein the pillars do not include a resistivity-switching binary metal oxide or nitride.

A preferred embodiment of the invention provides for a method for forming a monolithic three dimensional memory array, the method comprising: a) forming a first memory level above a substrate by a method comprising: i) forming a plurality of first substantially parallel conductors extending in a first direction; ii) forming first pillars above the first conductors, each first pillar comprising a first conductive layer or layerstack above a vertically oriented diode, the first pillars formed in a single photolithography step; iii) depositing a first dielectric layer above the first pillars; iv) etching a plurality of substantially parallel first trenches in the first dielectric layer, the first trenches extending in a second direction, wherein, after the etching step, the lowest point in the trenches is above the lowest point of the first conductive layer or layerstack, wherein the first conductive layer or layerstack does not comprise a resistivity-switching metal oxide or nitride; and b) monolithically forming a second memory level above the first memory level.

Another aspect of the invention provides for a first memory level formed above a substrate, the first memory level comprising: a plurality of substantially parallel, substantially coplanar bottom conductors extending in a first direction; a plurality of substantially parallel, substantially coplanar top conductors extending in a second direction different from the first direction, the top conductors above the bottom conductors; and a plurality of first pillars, each first pillar vertically disposed between one of the bottom conductors and one of the top conductors, each first pillar comprising a vertically oriented diode and a conductive layer or layerstack, the conductive layer or layerstack above the vertically oriented diode, wherein the conductive layer or layerstack of each first pillar is in contact with one of the top conductors, and wherein the conductive layer or layerstack comprises a layer of a metal or a metal alloy.

Another preferred embodiment provides for a monolithic three dimensional memory array comprising: a) a first memory level above a substrate, the first memory level comprising: i) a plurality of substantially parallel, substantially coplanar bottom conductors extending in a first direction; ii) a plurality of substantially parallel, substantially coplanar top conductors extending in a second direction different from the first direction, the top conductors above the bottom conductors; and iii) a plurality of first pillars, each first pillar vertically disposed between one of the bottom conductors and one of the top conductors, each first pillar comprising a vertically oriented diode and a conductive layer or layerstack, the conductive layer or layerstack above the vertically oriented diode, wherein the conductive layer or layerstack of each first pillar is in contact with one of the top conductors, wherein the conductive layer or layerstack comprises a layer of a metal or a metal alloy; and b) a second memory level monolithically formed above the first memory level.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
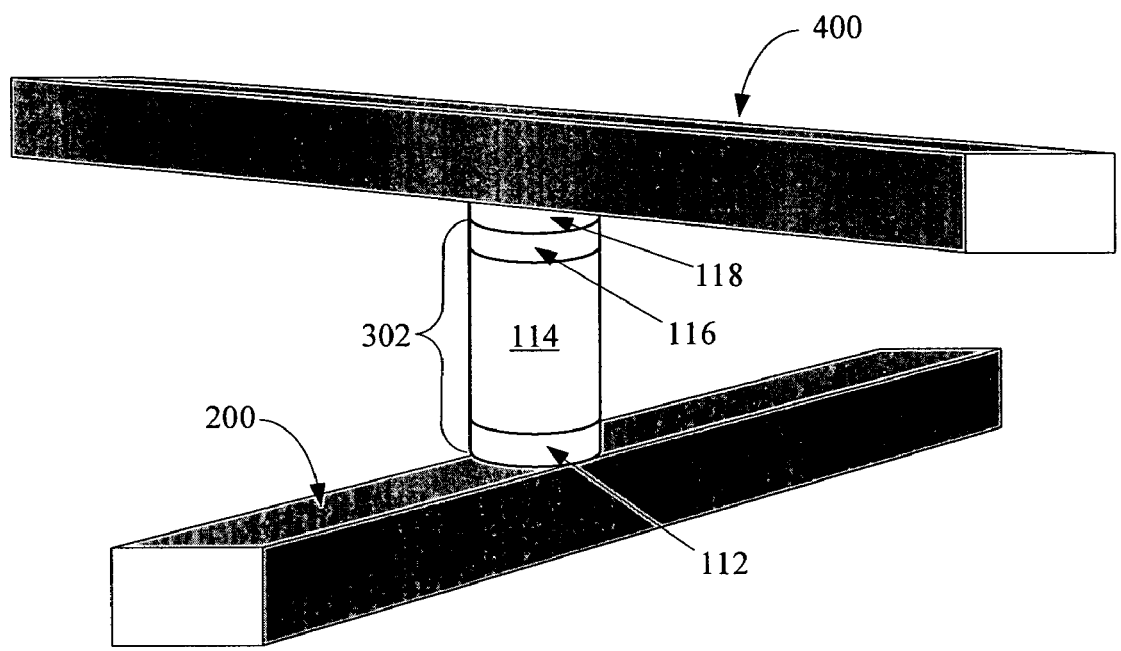
FIG. 1 is a perspective view of a prior art nonvolatile memory cell not formed according to methods of the present invention.

Herner et al., U.S. Pat. No. 6,952,030, "High-Density Three-Dimensional Memory Cell," hereinafter the '030 patent and hereby incorporated by reference, discloses a nonvolatile memory cell including a vertically oriented junction diode and a dielectric rupture antifuse interposed between top and bottom conductors. Turning to FIG. 1, vertically oriented junction diode 302 comprises heavily doped semiconductor layer 112 of a first conductivity type, layer 114 which is undoped semiconductor material or lightly doped semiconductor material, and heavily doped semiconductor layer 116 of the second conductivity type. The semiconductor material of diode 302 is generally silicon, germanium, or an alloy of silicon and/or germanium. Diode 302 and dielectric rupture antifuse 118 are arranged in series between bottom conductor 200 and top conductor 400, which may be formed of a metal such as tungsten. Various additional adhesion and barrier layers are not shown.

The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

In the initial state of the memory cell of FIG. 1, very little current flows through diode 302 when a read voltage is applied between top conductor 400 and bottom conductor 200. Antifuse 118 impedes current flow, and in most embodiments the polycrystalline semiconductor material of diode 302 is formed in a relatively high-resistivity state, as described in Herner et al., U.S. patent application Ser. No. 10/955,549, "Nonvolatile Memory Cell Without a Dielectric Antifuse Having High- and Low-Impedance States," filed Sep. 29, 2004 and hereinafter the '549 application; and Herner et al., U.S. patent application Ser. No. 11/148,530, "Nonvolatile Memory Cell Operating by Increasing Order in Polycrystalline Semiconductor Material," filed Jun. 8, 2005 and hereinafter the '530 application, both hereby incorporated by reference, which also tends to impede current flow. Application of a programming voltage between top conductor 400 and bottom conductor 200 causes dielectric breakdown of the antifuse material, permanently forming a conductive path through antifuse 118. The semiconductor material of diode 302 is altered as well, changing it to a lower-resistivity state. After programming, a readily detectable current flows between top conductor 400 and bottom conductor 200 upon application of a read voltage. In this way a programmed cell can be distinguished from an unprogrammed cell.

Figure 2:
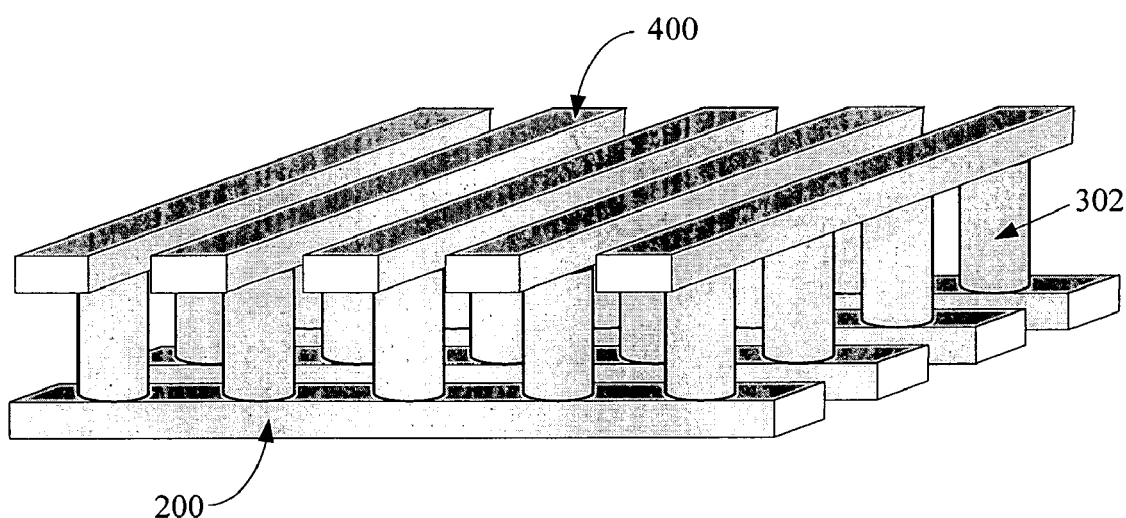
FIG. 2 is a perspective view of a portion of a first memory level of the memory cell of FIG. 1.

FIG. 2 shows a portion of a first memory level of memory cells like the cell of FIG. 1. Two, three, four, or more such memory levels may be formed, stacked one atop the other, to form a monolithic three dimensional memory array, preferably formed above a semiconductor substrate such as a monocrystalline silicon wafer, and described in the '030 patent and the '549 and '530 applications.

Features in semiconductor devices are generally formed either by subtractive or by Damascene methods. In a subtractive method, a material is patterned and etched into a desired shape, then gaps between etched features filled with dielectric. In a Damascene method, features are formed by forming voids in dielectric, then filling those voids with conductive or semiconductor material.

Figure 3A:
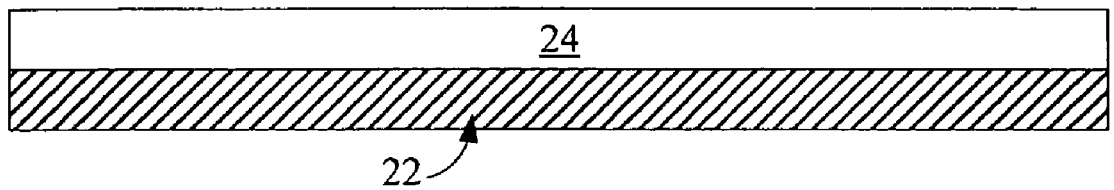
FIGS. 3a-3d are cross-sectional views illustrating formation of conductive rails by a subtractive method.
Figure 3B:
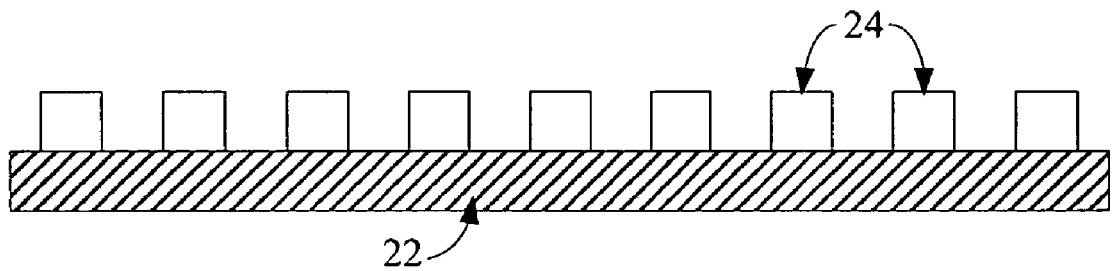
Figure 3C:
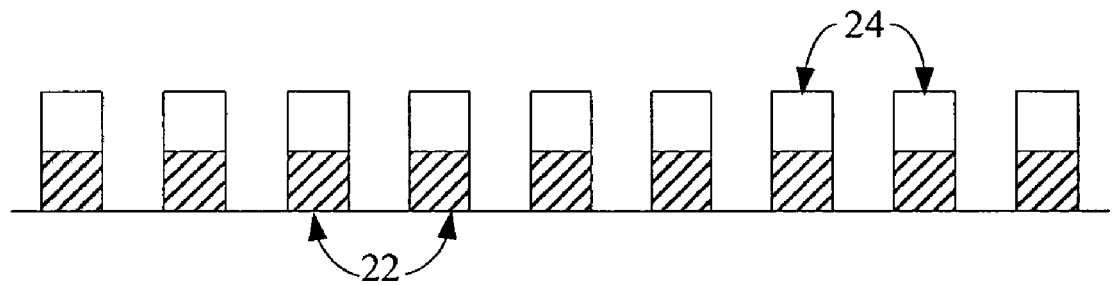
Figure 3D:
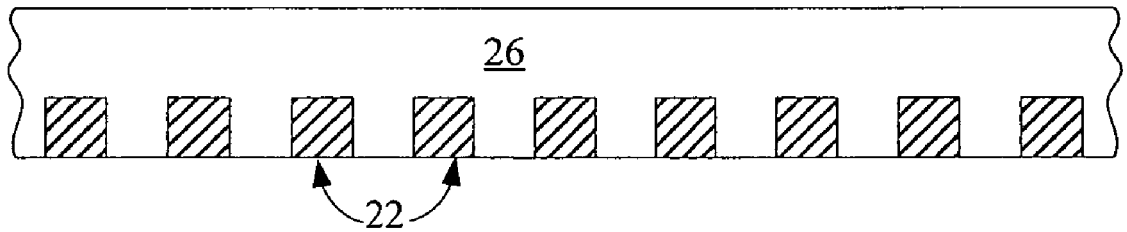

For example, to form metal rail-shaped conductors subtractively, as shown in FIG. 3a, metal layer 22 is deposited, and photoresist 24 is spun onto it. As shown in FIG. 3b, photoresist 24 is then photolithographically patterned into the desired form. As shown in FIG. 3c, an etch step removes metal where it is not protected by photoresist. As in FIG. 3d, after etch, the photoresist is stripped, leaving metal rails behind, and gaps between the rails can be filled by dielectric 26. If desired, overfill of dielectric can be removed, for example by chemical-mechanical planarization (CMP), to expose rails at a planarized surface.

Figure 4A:
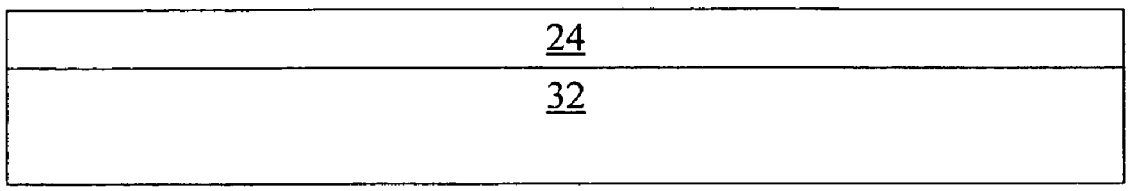
FIGS. 4a-4d are cross-sectional views illustrating formation of conductive rails by a Damascene method.
Figure 4B:
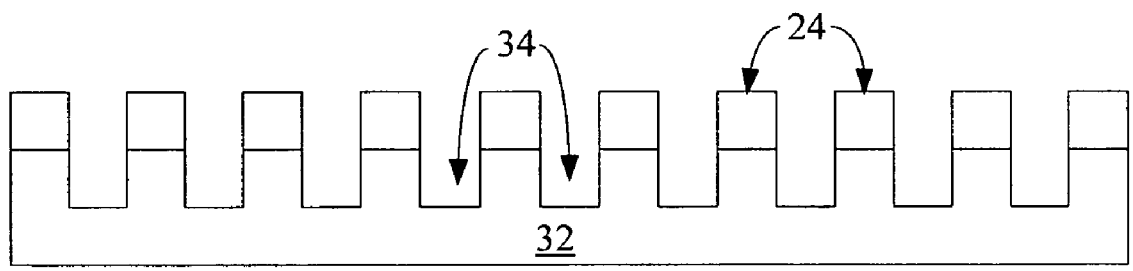
Figure 4C:
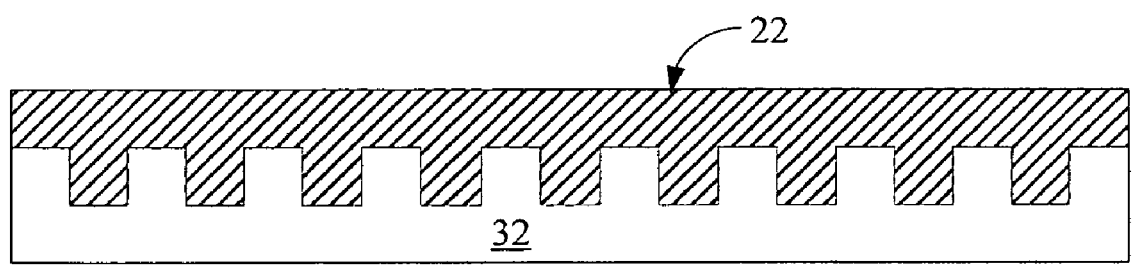
Figure 4D:
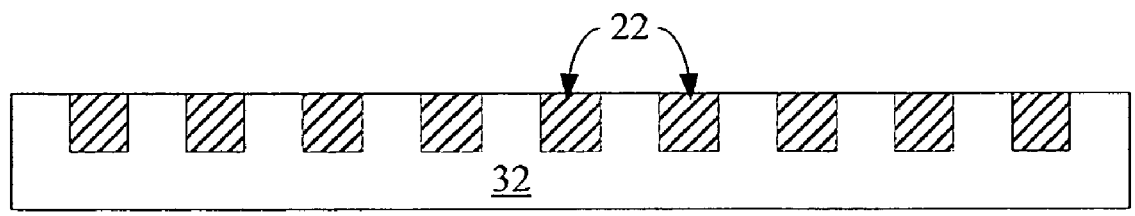

In contrast, turning to FIG. 4a, to form metal rail-shaped conductors using a Damascene method, photoresist 24 is spun onto deposited oxide layer 32. As in FIG. 4b, photoresist 24 is patterned as shown, then an etch forms trenches 34 in oxide layer 32. In FIG. 4c, after removal of photoresist, metal 22 deposited to fill trenches, and the overfill removed, for example by CMP, forming rails, shown in FIG. 4d.

Referring to FIG. 1, in embodiments of the '030 patent, bottom conductors 200 and top conductors 400 are formed by subtractive methods. For reasons to be explained, in some embodiments it may be desirable to form these conductors using a Damascene method instead.

Figure 5A:
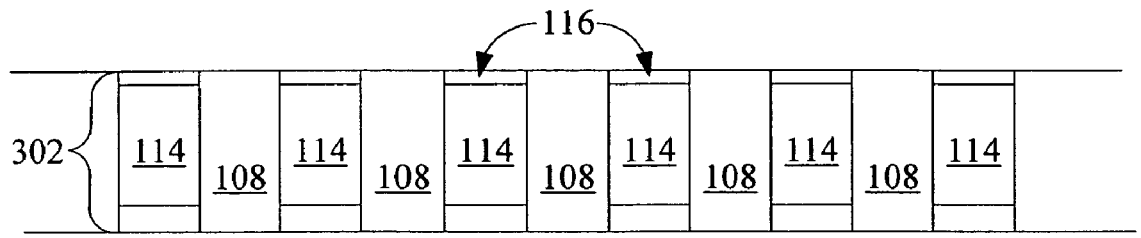
FIGS. 5a-5c are cross-sectional views illustrating stages in formation of a structure including top conductors formed by a Damascene method not using methods of the present invention.
Figure 5B:
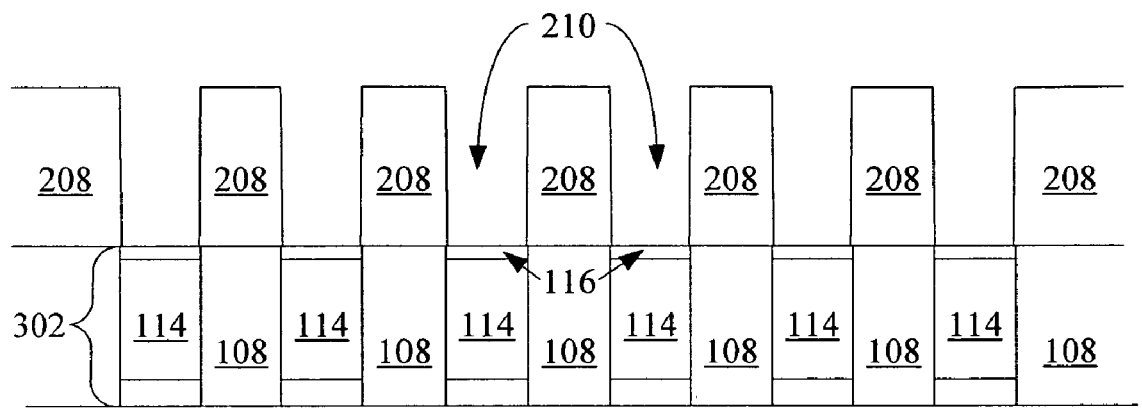

Forming top conductors 400 to connect to vertically oriented diodes 302 presents challenges, however. FIG. 5a shows diodes 302 with dielectric 108 between them exposed at a planarized surface. Top heavily doped region 116 is very thin. As in FIG. 4b, dielectric layer 208 is deposited, and then trenches 210 are etched. In an ideal case, as shown in FIG. 5b, the trench etch stops precisely at the top of each diode 302 with no misalignment.

Figure 5C:
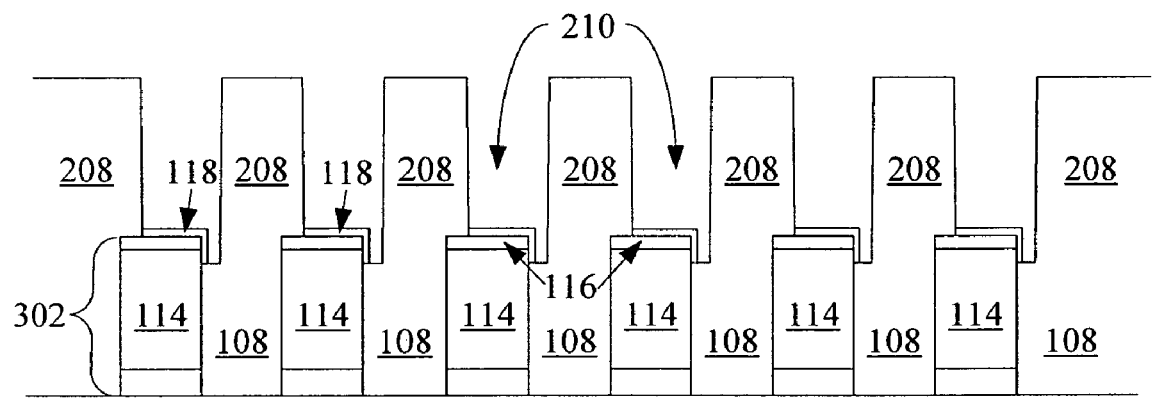

In reality, however, there will nearly always be some misalignment, which will result in overetch. Turning to FIG. 5c, overetch with misalignment will expose the side of diodes 302. An antifuse layer 118 is formed on each diode at this point, preferably by thermal oxidation of the silicon of diode 302 to form a silicon dioxide layer. Heavily doped region 116 is very thin, and when antifuse 118 ruptures during programming of the cell, the conductor to be formed in the etched trench 210 may make electrical contact to intrinsic region 114. This contact is fatal to the device.

The methods of the present invention prevent the fatal overetch depicted in FIG. 5c, and, as will be described, afford other advantages in improved diode uniformity, interconnectivity, and layer-to-layer alignment.

As described in the '030 patent and the '549 and '530 applications, in preferred embodiments diodes 302 were formed by depositing heavily doped n-type silicon layer 112, doped in situ, followed by a thickness 114 of intrinsic silicon. Silicon regions 112 and 114 were amorphous as deposited, and were crystallized later to polycrystalline silicon, or polysilicon. The silicon was then patterned and etched into pillars (a dielectric hard mask, for example of silicon dioxide, may have been used during the etch and subsequently removed), and gaps between the pillars filled, for example by high density plasma (HDP) oxide. A planarization step, for example by CMP, removed overfill of oxide to expose tops of diodes 302 at the planarized surface. This CMP step unavoidably also removed some thickness of silicon. After the CMP step, top heavily doped region 116 was formed by ion implantation of a p-type dopant, for example boron or $BF_2$, to form a shallow junction. (For simplicity, formation of a p-i-n diode having an n-region at the bottom and a p-region at the top, formed of silicon, has been described. In alternate embodiments, the polarity of the diode could be reversed, or the semiconductor may be germanium, a silicon-germanium alloy, or some other material.) In preferred embodiments of the '030 patent and the '549 and '530 applications, top conductors were then formed subtractively.

Figure 6A:
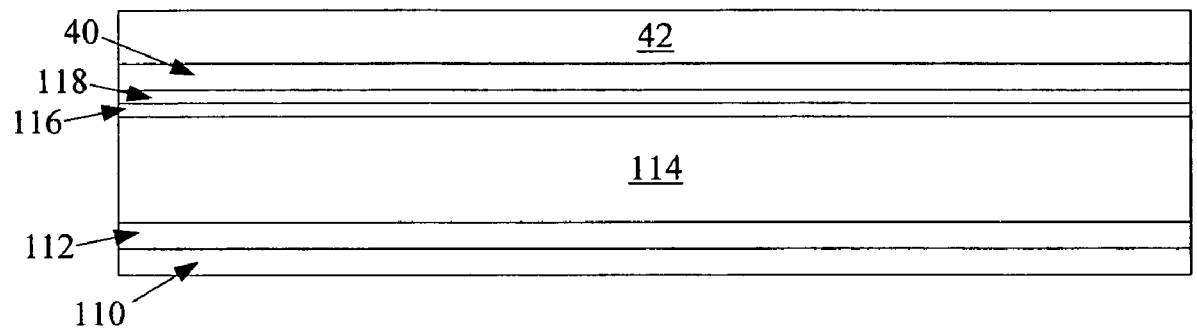
FIGS. 6a-6c are cross-sectional views illustrating stages in formation of structure formed according to an embodiment of the present invention.

Turning to FIG. 6a, in an embodiment of the present invention, heavily doped n-type silicon region 112 and intrinsic silicon region 114 are deposited, generally on titanium nitride barrier layer 110. Heavily doped p-type silicon region 116 is either deposited and doped by ion implantation or is doped in situ during deposition. Dielectric rupture antifuse 118 is formed, for example by thermal oxidation of the underlying silicon to form silicon dioxide. A conductive layerstack is deposited on antifuse 118; this conductive layerstack may include, for example, titanium nitride adhesion layer 40 and tungsten layer 42. Barrier layer 110, silicon regions 112, 114, and 116, antifuse layer 118, titanium nitride layer 40 and tungsten layer 42 are all unpatterned at the stage illustrated in FIG. 6a. For simplicity, bottom conductors 200, below the illustrated structure, are not shown.

Figure 6B:
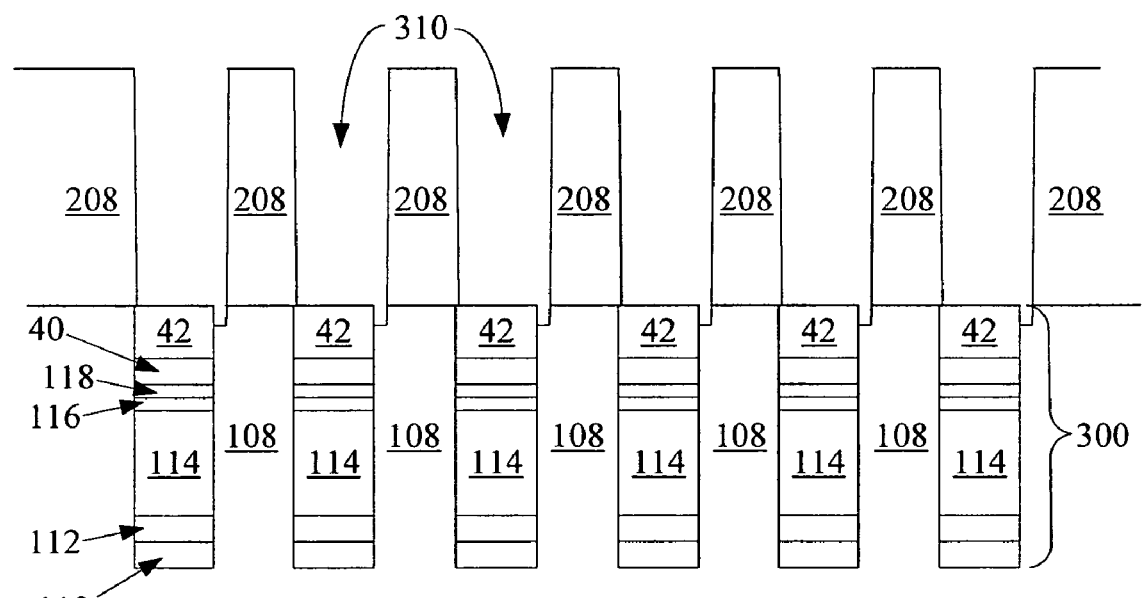

Turning to FIG. 6b, next tungsten layer 42 and titanium nitride layer 40 are patterned and etched into pillars. The etch continues, etching antifuse layer 118, silicon regions 116, 114, and 112, and barrier layer 110, forming pillars 300. Tungsten layer 42 and titanium nitride layer 40 serve as a hard mask during the silicon etch. A hard mask is an etched layer which serves to pattern the etch of an underlying layer; if all of the photoresist has been consumed, the hard mask can provide the pattern in its stead. The pillars are formed in a single photolithographic step. Dielectric fill 108 fills gaps between pillars 300, and the overfill is removed by planarization, for example by CMP.

Figure 6C:
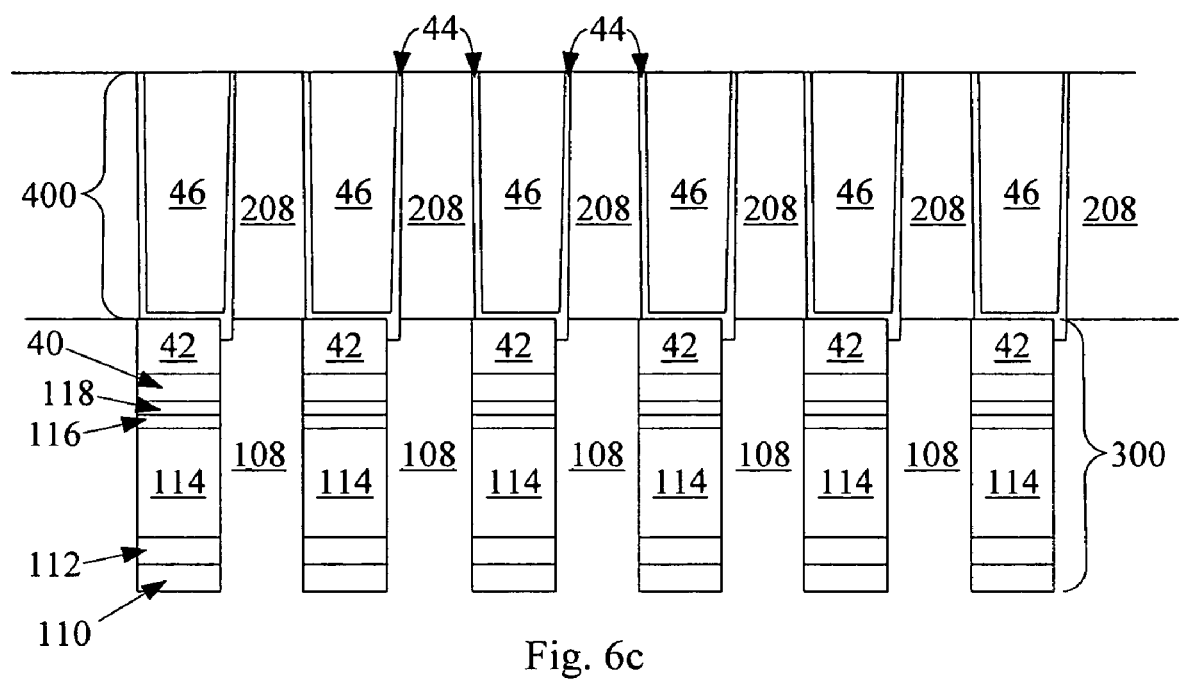

Next dielectric material 208 is deposited, and trenches 310 are etched in dielectric material 208. Conductors will be formed in trenches 310 using Damascene construction. Some misalignment and overetch of trenches 310 may occur, as shown. FIG. 6c shows the structure after trench 310 has been filled with titanium nitride layer 44 and tungsten layers 46, and CMP performed to complete top conductors 400. As will be seen in FIG. 6c, the trench overetch causes conductors 400 to contact the side of tungsten layer 42 or titanium nitride layer 40, but not region 116, 114, or any part of the diode underneath. The thickness of tungsten layers 42 and titanium nitride layers 40 provides a margin within which the trench etch can stop with no adverse effect on device performance. The conductive layers 42 and 40 may be exposed in trenches 310, but the semiconductor layers 112, 114, and 116 beneath are not.

In the present invention, then, a conductive hard mask is used to etch underlying features, and then to protect those features during a subsequent Damascene etch performed to form conductors which will provide electrical connectivity to the underlying features. Dielectric materials, like silicon dioxide or silicon nitride, are commonly used as hard masks. Because the hard mask of the present invention is of a conductive material, it need not be removed and can remain in the finished device.

In the embodiment described above, the methods of the invention bring additional advantages. As described, the vertically oriented diode of the present invention is a p-i-n diode. (A junction diode is considered to be vertically oriented if the p region is above or below the n region.) In a memory array, it is desirable to minimize variation between memory cells. The forward current and reverse leakage of the diode in this memory is strongly dependent on the thickness of intrinsic region 114.

In the method of fabrication described in FIGS. 5a-5c, there are several sources of variability among diodes. The rate of silicon deposition varies across a wafer, leading to variation in overall silicon thickness. Deposition of HDP oxide fill between the diodes is also nonuniform across the wafer and between wafers, as is the CMP step performed to expose the tops of the diodes at a planar surface as shown in FIG. 5a. Each of these sources of nonuniformity affects the ultimate thickness of the intrinsic region. In the present invention, however, the etch and HDP fill are performed only after the thicknesses of the diode regions has been established, and no CMP step is performed on the silicon. In the final memory array, variation in intrinsic regions is much reduced, as the only source of variation is inconsistency of silicon thickness during deposition. Further, sputtering inherent in an HDP fill process can cause corner clipping at the tops of features. When the conductive hard mask is used, the hard masks absorb this clipping rather than the diodes.

At smaller pitch, the width of conductors in a memory array like that shown in FIG. 2 must necessarily decrease. To provide adequate conductivity, conductors thus must become taller. Very thick layers can be difficult to etch, as the photoresist defining the feature may be entirely consumed before the etch is complete. Very high aspect ratio gaps also are difficult to fill without voids. Damascene construction avoids both of these disadvantages and thus may become an attractive option for conductors at smaller pitch. Further, due to the nature of photolithography, in general the dimensions of etched features tend to shrink, making them narrower than their projected mask size. Conductors formed subtractively thus tend to be smaller. When formed by a Damascene method, however, it is the dielectric fill rather than the conductors which are etched, and which thus tend to shrink during pattern and etch. For a given mask dimension, then, Damascene conductors will be slightly wider and thus slightly more conductive.

A multilevel memory array requires many masking steps. Each layer must be aligned to the previous layer. Alignment of a photomask is achieved by locating alignment marks formed in prior layers. To pattern and etch tungsten conductors subtractively, for example, the photomask must be aligned to an alignment mark which is covered by tungsten, which is opaque. To form tungsten conductors by a Damascene method, the photomask must be aligned to an alignment mark covered by oxide, which is generally transparent.

A detailed example of fabrication of a first memory level of a monolithic three dimensional memory array will be provided. For completeness, many materials, conditions, and step will be described. It will be understood, however, that many of these details can be modified, augmented, or omitted while the results fall within the scope of the invention.

Many details that may prove useful to forming the memory to be described below will be found in the '030 patent, the '549 and '530 applications, and in Herner et al., U.S. patent application Ser. No. 11/125,606, "High-Density Nonvolatile Memory Array Fabricated at Low Temperature Comprising Semiconductor Diodes," filed May 9, 2005; and in Herner et al., U.S. patent application Ser. No. 11/125,939, "Rewriteable Memory Cell Comprising a Diode and a Resistance-Switching Material," filed May 9, 2005, both hereby incorporated by reference. To avoid obscuring the invention, not all details from this patent and these applications will be included, but it will be understood that no teaching from them is intended to be excluded.

EXAMPLE

Figure 7A:
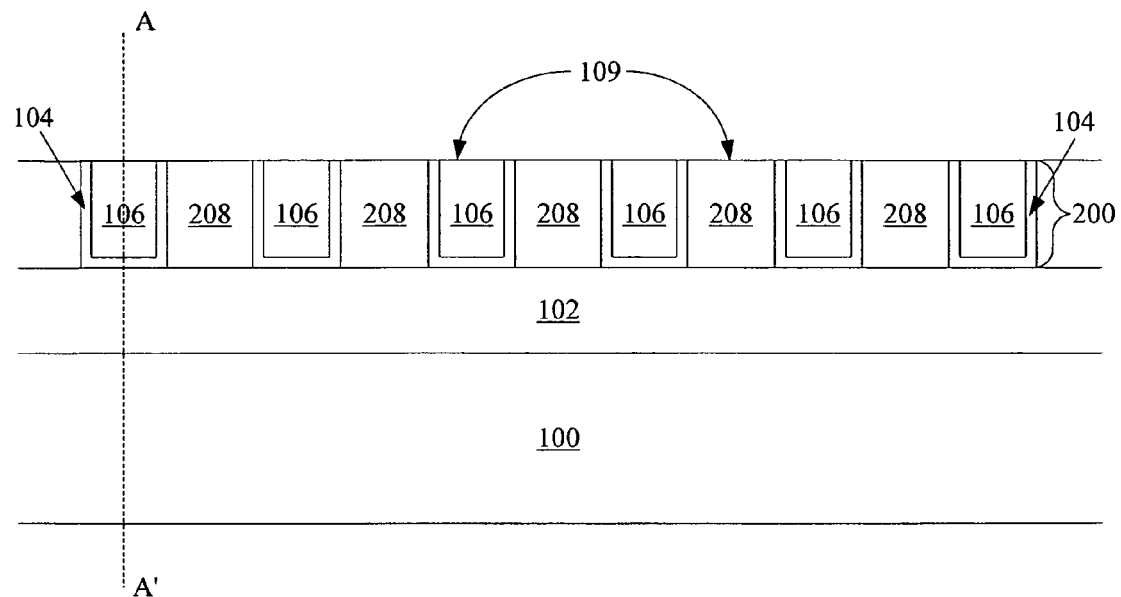
FIGS. 7a-7d are cross-sectional views illustrating stages in formation of a first memory level of a monolithic three dimensional memory array formed according to a preferred embodiment of the present invention.

Turning to FIG. 7a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. First conductors 200 are preferably formed by a Damascene method, but may be formed subtractively instead.

To form Damascene conductors, a thickness of dielectric material 208, preferably between about 1500 and about 3000 angstroms, for example about 2000 angstroms, is deposited. Dielectric material 208 is preferably a uniform dielectric such as TEOS.

Substantially parallel trenches are etched in dielectric 208. In one embodiment, these trenches are about 2000 angstroms deep. This etch may be timed, or, if desired, may stop on a previously deposited etch stop layer (not shown.)

The pitch and feature size of the conductors may be as desired. In the memory array to be formed the advantages of the methods of the present invention become more useful at smaller pitch, for example less than about 200 nm, for example between about 160 nm and about 90 nm. Trenches 310 in dielectric 208 may be less than about 100 nm wide, for example between about 80 and about 45 nm wide.

Any appropriate conductive material can be used to form conductors 200, such as a metal, metal alloy, conductive metal silicide, heavily doped silicon, etc. In a preferred embodiment, an adhesion layer 104, for example of titanium nitride, is deposited. Layer 104 may be between about 50 and about 400 angstroms thick, preferably about 100 angstroms thick. A conductive material 106, preferably tungsten or a tungsten alloy, is deposited to fill the trenches etched in dielectric 208. If some material other than tungsten is used, adhesion layer 104 may not be required.

Finally, excess tungsten and titanium nitride is removed, forming conductor rails 200 separated by dielectric material 208, and leaving a substantially planar surface 109. The resulting structure is shown in FIG. 7a. This removal of dielectric overfill to form planar surface 109 can be performed by any process known in the art, such as CMP or etchback. Some thickness of dielectric 208 will be removed during this CMP step; thus the final height of conductor rails 200 may be somewhat less than the initial thickness of dielectric layer 208 and the original depth of trenches; for example the height of conductor rails 200 may be about 1700 angstroms.

Figure 7B:
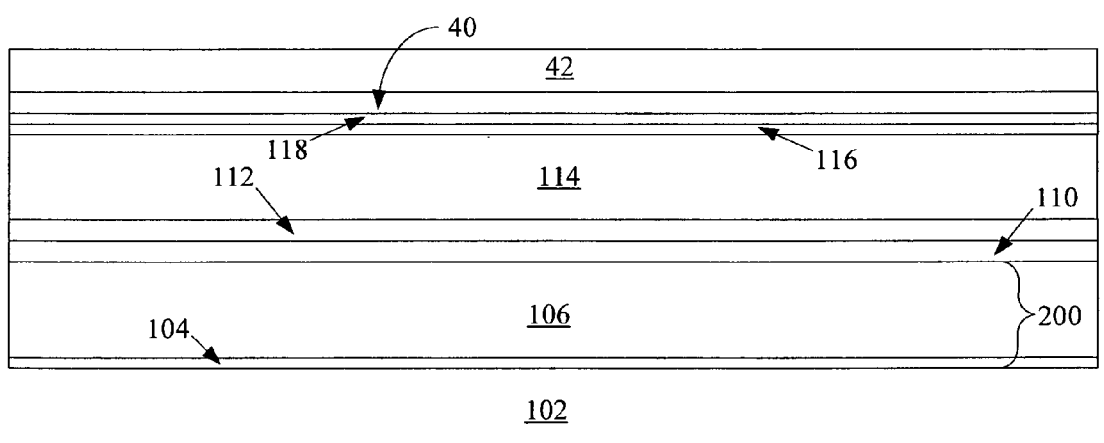

Next, turning to FIG. 7b, vertical pillars will be formed above completed conductor rails 200. FIG. 7b is rotated 90 degrees relative to FIG. 7a along line A-A' of FIG. 7a; in FIG. 7a conductors 200 extended out of the page, while in FIG. 7b they extend left-to-right across the page. (To save space substrate 100 is omitted in FIG. 7b; its presence will be assumed.) If tungsten was used for conductive layer 106, it is preferred to use a barrier layer 110 between the lower conductor rails 200 and the semiconductor material to be deposited. Barrier layer 110 is any conventional conductive barrier material, for example titanium nitride. Its thickness can be, for example, about 50 to about 200 angstroms, preferably about 100 angstroms.

Next semiconductor material that will be patterned into pillars is deposited. The semiconductor material can be silicon, germanium, alloys of silicon and/or germanium, or other suitable semiconductor materials. Silicon is commonly used in the industry, so, for simplicity, this description will refer to the semiconductor material as silicon, but it will be understood that other materials may be substituted.

In preferred embodiments, the semiconductor pillar comprises a junction diode, the junction diode comprising a bottom heavily doped region of a first conductivity type and a top heavily doped region of a second conductivity type. The middle region, between the top and bottom regions, is an intrinsic or lightly doped region of either the first or second conductivity type. The middle region can intentionally be lightly doped, or it can be intrinsic. An intrinsic region will never be perfectly electrically neutral, and will always have defects or contaminants that cause it to behave as if slightly n-doped or p-doped.

In a preferred embodiment, heavily doped silicon region 112 is formed by a conventional method, for example by chemical vapor deposition (CVD). Heavily doped region 112 is preferably doped in situ. In this example, heavily doped region 112 will be n-type, while the top heavily doped region to be formed will be p-type; clearly the polarity of these diodes may be reversed. Heavily doped n-type region 112 is preferably between about 100 and about 1000 angstroms thick, preferably about 200 angstroms thick.

Next a thickness of intrinsic silicon 114 is deposited. This thickness is preferably between about 800 and about 2800 angstroms thick, most preferably about 2000 angstroms. If desired, this region may be lightly doped. Finally, top heavily doped region 116 is formed. This region may be implanted with a p-type dopant such as boron or $BF_2$. In an alternative embodiment, heavily doped region 116 is in situ doped. The thickness of silicon diode stack 112, 114, and 116 is complete at this point. Generally regions 112, 114, and 116 will be amorphous as deposited and will be crystallized by an anneal or by subsequent thermal processing. In the finished memory, the diodes will preferably be polysilicon.

Next dielectric rupture antifuse layer 118 is formed. Antifuse 118 is preferably a silicon dioxide layer formed by oxidizing the underlying silicon in a rapid thermal anneal, for example at about 600 degrees. Antifuse 118 may be about 20 angstroms thick. Alternatively, antifuse 118 can be deposited.

Next a conductive layer or layerstack that will be patterned to form a hard mask is deposited. The thickness of this layerstack should be sufficient that a subsequent Damascene etch can reliably be stopped before this thickness is exceeded. In one example titanium nitride layer 40, about 200 angstroms thick, and tungsten layer 42, about 400 angstroms thick, are deposited. It may be preferred for tungsten layer 42 to be formed by sputtering, as sputtered tungsten is smoother and more readily patterned, resulting an a more uniform patterned feature after etch. In alternative embodiments, CVD tungsten may be used instead, and may be subjected to a CMP step to reduce surface roughness. Other materials may be used in the conductive layer or layerstack. The thickness of this conductive layer or layerstack may be adjusted as required, depending on the depth of the Damascene etch to be performed in a following step, the material to be etched, the controllability of this etch, etc. FIG. 7b shows the structure at this point.

Figure 7C:
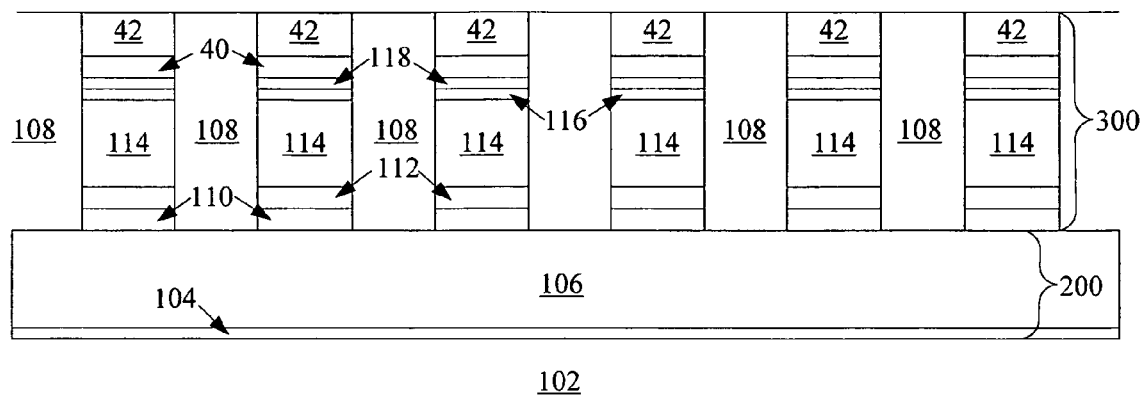

Turning to FIG. 7c, tungsten layer 42, titanium nitride layer 40, antifuse 118, silicon regions 116, 114, and 112, and barrier layer 110 will be patterned and etched to form pillars 300. Conductive layers 40 and 42 constitute hard mask. This etch may be performed in a single etch chamber, modifying etch chemistry as required; alternatively conductive layers 42 and 40 may be etched in a metal etcher, then the wafer transferred to a polysilicon etcher where the silicon layers are etched. In either case, the layers 42 and 40 can be considered to serve as a hard mask during etch of underlying layers.

Pillars 300 should have about the same pitch and about the same width as conductors 200 below, such that each pillar 300 is formed on top of a conductor 200. Some misalignment can be tolerated. Pillars 300 can be formed using any suitable masking and etching process. For example, photoresist can be deposited, patterned using standard photolithography techniques, and etched, and then the photoresist removed. Preferably a layer of dielectric antireflective coating (DARC), for example about 320 angstroms, is deposited on tungsten layer 42 before the etch. In some embodiments it may be preferred to include an additional layer or layers above tungsten layer 42 during this photolithography and etch step. For example, 1500 angstroms of silicon dioxide (not shown) may be deposited directly on tungsten layer 42, then DARC deposited on this oxide layer. This will prevent or minimize loss of tungsten thickness during the subsequent etch. The oxide layer will be removed and will not exist in the finished device.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, "Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between pillars 300, filling the gaps between them. Dielectric material 108 is preferably high density plasma oxide, though other suitable dielectric materials may be used instead.

Next the dielectric material on top of the pillars 300 is removed, exposing the tops of pillars 300 separated by dielectric material 108, and leaving a substantially planar surface. This removal of dielectric overfill and planarization can be performed by any process known in the art, such as CMP or etchback. For example, the etchback techniques described in Raghuram et al., U.S. application Ser. No. 10/883,417, "Nonselective Unpatterned Etchback to Expose Buried Patterned Features," filed Jun. 30, 2004 and hereby incorporated by reference in its entirety, can advantageously be used. The resulting structure is shown in FIG. 7c.

Note that each pillar 300 comprises a vertically oriented diode, a dielectric rupture antifuse, and a conductive layerstack. These pillars do not comprise a resistance-switching element, such as a binary metal oxide or nitride, as in embodiments of Herner et al., U.S. patent application Ser. No. 11/395,995, "Nonvolatile Memory Cell Comprising a Diode and a Resistance-Switching Material," filed Mar. 31, 2006 and hereby incorporated by reference.

Figure 7D:
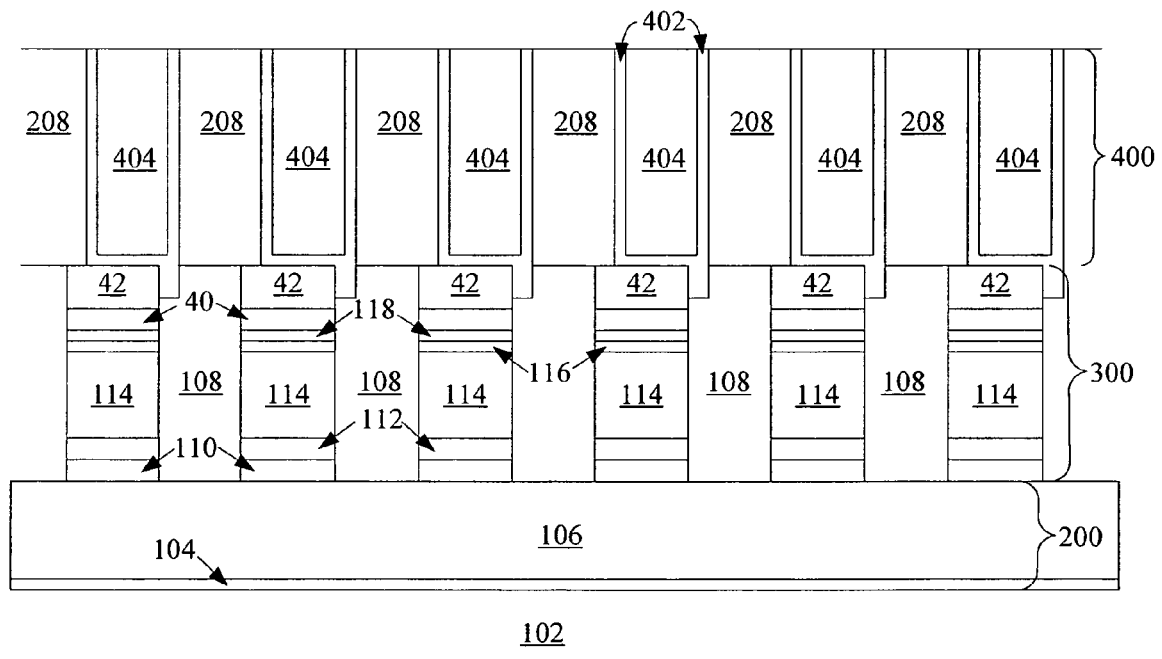

Overlying conductors can be formed in the same manner as the underlying conductors. Turning to FIG. 7d, a thickness of dielectric material 208, preferably between about 1500 and about 2000 angstroms, for example about 1700 angstroms, is deposited. Dielectric material 208 is preferably a uniform dielectric such as TEOS.

Substantially parallel trenches are etched in dielectric 208. In one embodiment, these trenches are about 1700 angstroms deep. This etch may be timed, or the etch may be stopped when tungsten at the top of pillars 300 is detected. If desired, to make the appearance of tungsten more readily detectable, larger tungsten structures (not shown) can be formed outside of the array area during the same etch step that forms the conductive hard mask. When these larger tungsten areas are detected, it can be assumed that the same thickness of fill 208 has been etched inside the array area as outside and that tops of pillars 300 thus must be exposed, and etching can be stopped.

The trench etch can readily be stopped before any portion of the underlying diodes is exposed. The lowest point in the trenches is above the lowest point of the conductive layerstack including tungsten layer 42 and titanium nitride layer 40.

The trenches in dielectric 208, in which top conductors 400 will be formed, should extend in a second direction different from the direction of bottom conductors 200, preferably substantially perpendicular to them. These trenches (and top conductors 400) should have the same pitch as underlying pillars 300, such that each pillar is vertically disposed between one of bottom conductors 200 and one of top conductors 400. This pitch is preferably between about 90 nm and about 200 nm, for example about 160 nm. Some misalignment can be tolerated.

Any appropriate conductive material can be used to form conductors 400. In a preferred embodiment, an adhesion layer 402, for example of titanium nitride, is deposited. Layer 402 may be between about 100 and about 400 angstroms thick, preferably about 100 angstroms thick. A conductive material 404, preferably tungsten, is deposited to fill trenches 310 in dielectric 208. If some material other than tungsten is used, adhesion layer 402 may not be required. In alternative embodiments, conductive material 404 may be some other conductive material such as aluminum or copper, or alloys thereof, using known methods.

Finally, excess tungsten and titanium nitride is removed, forming conductor rails 400 separated by dielectric material 208, and leaving a substantially planar surface. This removal of dielectric overfill to form a planar surface can be performed by any process known in the art, such as chemical mechanical planarization (CMP) or etchback. The resulting structure, shown in FIG. 7d, is a bottom or first story of memory cells. Note that each of the conductors 400 is electrically in contact with the conductive layerstack of the underlying pillars 300; for example titanium nitride layer 402, contacts tungsten layer 42. This conductor-to-conductor contact provides for reliable interconnectivity even in case of substantial misalignment.

Additional memory levels can be formed above this first memory level. In some embodiments, conductors can be shared between memory levels; i.e. top conductor 400 would serve as the bottom conductor of the next memory level. In other embodiments, an interlevel dielectric is formed above the first memory level of FIG. 7d, its surface planarized, and construction of a second memory level begins on this planarized interlevel dielectric, with no shared conductors. Ultimately the memory can be several stories high.

Each memory level comprises memory cells, each cell comprising a portion of a bottom conductor, one of the pillars, and a portion of a top conductor.

Throughout this description, one layer has been described as being "above" or "below" another. It will be understood that these terms describe the position of layers and elements relative to the substrate upon which they are formed, in most embodiments a monocrystalline silicon wafer substrate; one feature is above another when it is farther from the wafer substrate, and below another when it is closer. Though clearly the wafer, or the die, can be rotated in any direction, the relative orientation of features on the wafer or die will not change.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a semiconductor device, the method comprising:
   depositing a layer of semiconductor material;
   depositing a first conductive layer or layerstack above the semiconductor material;
   patterning and etching the first conductive layer or layerstack and the semiconductor material into first pillars in a single photolithography step;
   depositing a dielectric layer above the first pillars; and
   etching trenches in the dielectric layer, wherein a portion of the first conductive layer or layerstack is exposed in the trenches,
   wherein the semiconductor material is not exposed in the trenches,
   wherein the pillars do not include a resistivity-switching binary metal oxide or nitride; and
   wherein the pillars are etched to have a pillar width, the trenches are etched to have a trench width, and the trench width is at least as wide as the pillar width.

2. The method of claim 1 further comprising forming top conductors by filling the trenches with second conductive material and planarizing to remove overfill of the second conductive material.

3. The method of claim 2 wherein the top conductors comprise tungsten, copper, or aluminum.

4. The method of claim 1 wherein the step of depositing a layer of semiconductor material comprises:
   depositing a bottom heavily doped region of a first conductivity type;
   depositing an undoped or lightly doped middle region above and in contact with the bottom heavily doped region.

5. The method of claim 4 wherein the step of depositing a layer of semiconductor material further comprises depositing a top heavily doped region of a second conductivity type above and in contact with the undoped or lightly doped middle region, the second conductivity type opposite the first, the top heavily doped region doped by in situ doping.

6. The method of claim 4 wherein the step of depositing a layer of semiconductor material further comprises forming a top heavily doped region of a second conductivity type by doping a top portion of the middle undoped or lightly doped region by ion implantation, the second conductivity type opposite the first.

7. The method of claim 1 wherein the semiconductor material is silicon, germanium, or an alloy of silicon and/or germanium.

8. The method of claim 7 wherein the semiconductor material is silicon.

9. The method of claim 7 wherein, in the completed device, the semiconductor material is polycrystalline.

10. The method of claim 1 wherein each of the first pillars comprises a vertically oriented diode.

11. The method of claim 10 wherein each diode is a semiconductor junction diode.

12. The method of claim 11 wherein each semiconductor junction diode is a p-i-n diode.

13. The method of claim 1 further comprising, before the step of depositing the first conductive layer or layerstack above the semiconductor material, forming a dielectric rupture antifuse layer on and in contact with the layer of semiconductor material.

14. The method of claim 13 wherein the dielectric rupture antifuse comprises silicon dioxide.

15. The method of claim 1 wherein the first conductive layer or layerstack comprises a metal or metal alloy.

16. The method of claim 15 wherein the metal or metal alloy is tungsten or a tungsten alloy.

17. The method of claim 16 wherein the tungsten or tungsten alloy is sputtered tungsten.

* * * * *